(12) United States Patent
Lin et al.

(10) Patent No.: US 8,239,788 B2
(45) Date of Patent: Aug. 7, 2012

(54) FRAME CELL FOR SHOT LAYOUT FLEXIBILITY

(75) Inventors: Chih-Wei Lin, Hsin-Chu (TW);
Yung-Cheng Chen, Hsin-Chu (TW);
Heng-Jen Lee, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 313 days.

(21) Appl. No.: 12/537,836

(22) Filed: Aug. 7, 2009

(65) Prior Publication Data

US 2011/0033787 A1    Feb. 10, 2011

(51) Int. Cl.
G06F 17/50    (2006.01)
G03C 5/00    (2006.01)

(52) U.S. Cl. ............ 716/55; 716/50; 716/54; 716/56; 430/30

(58) Field of Classification Search .................. None
See application file for complete search history.

(56) References Cited

U.S. PATENT DOCUMENTS

| | | | | |
|---|---|---|---|---|
| 6,016,391 A * | 1/2000 | Facchini et al. | ............ | 716/55 |
| 6,433,352 B1 | 8/2002 | Oka | | |
| 6,546,544 B1 * | 4/2003 | Kawakami | ............ | 716/54 |
| 6,980,917 B2 * | 12/2005 | Ward et al. | ............ | 702/120 |
| 7,243,325 B2 * | 7/2007 | McIntyre et al. | ............ | 716/55 |
| 7,353,077 B2 * | 4/2008 | Lin et al. | ............ | 700/121 |
| 7,448,011 B2 | 11/2008 | Eshima | | |
| 7,587,703 B2 * | 9/2009 | Takita et al. | ............ | 716/51 |
| 7,882,481 B2 * | 2/2011 | Hempel | ............ | 716/54 |
| 2002/0127747 A1 | 9/2002 | Maltabes et al. | | |
| 2003/0163794 A1 | 8/2003 | Horie et al. | | |
| 2009/0007028 A1 | 1/2009 | Hempel | | |

* cited by examiner

*Primary Examiner* — Leigh Garbowski
*Assistant Examiner* — A. M. Thompson
(74) *Attorney, Agent, or Firm* — Duane Morris LLP

(57) ABSTRACT

A method includes receiving an integrated circuit chip size and determining a frame structure segment size based on the chip size. The frame structure segment size is less than the chip size. An initial shot layout having a chip count is established in which a number of shots, each including at least one frame structure segment and at least one chip, are arranged in vertically and horizontally aligned columns and rows. At least one additional shot layout is established in which at least one of a row or column of shots is offset from an adjacent row or column of shots. The initial shot layout is compared to the at least one additional shot layout, and a final shot layout is selected based in part on the total number of shots in the shot layout and has a final chip count that is greater than or equal to the initial chip count.

24 Claims, 6 Drawing Sheets

FRAME CELL FOR SHOT LAYOUT FLEXIBILITY

FIELD OF DISCLOSURE

The disclosed system and method relate to semiconductor fabrication processes. More specifically, the disclosed system and method relate to frame cell design layouts in semiconductor manufacturing.

BACKGROUND

The formation of various integrated circuit (IC) structures on a semiconductor wafer typically involves lithographic processes. Lithographic processors are used to transfer a pattern of a photomask to the semiconductor wafer. For example, a pattern may be formed on the wafer by passing light energy through a reticle, which transfers the pattern to the photoresist layer. After exposing a photoresist layer, a development cycle is performed. In order to increase the resolution and the quality of the exposure of the photoresist, a reticle is usually configured to expose only a portion of the wafer at a time. Each portion of the wafer that is exposed at once is referred to as an exposure field or a "shot" area. Accordingly, developing an entire wafer usually requires a lithographic processor to take multiple shots.

FIG. 1A illustrates a wafer 100 having a plurality of shots 102 disposed thereon. Each exposure or shot area 102 may include one or more chips 104 separated by scribe lines or "streets" 106 as illustrated in FIGS. 1B and 1C. Additionally, each shot area may include one or more alignment and monitor patterns, e.g., frame cell structure segments 108, which are disposed outside of the area that includes the chips 104. The frame cell structure segments 108 are typically fixed segments within a shot area and that are located around the periphery of a shot. The frame cell structure segments are usually arranged in a U-frame configuration as illustrated FIG. 1B or in an O-frame configuration 108a as illustrated in FIG. 1C. The alignment and monitor patterns 108, 108a are used to align or monitor process variations of a shot 102. Additionally, the frame cell segments 108, 108a provide areas to separate adjacent shots 102 when the wafer has been developed. The exposure is performed by interlocking, but not overlapping, the frame cell structure segments 108 of adjacent shots as illustrated in FIGS. 2A and 2B.

In conventional processing methods as illustrated in FIG. 1A, shots 102 are fully aligned with adjacent shots in both the x- and y-directions. At the periphery of the wafer, the dies in each edge shot have vacant space adjacent thereto, between the outer sides of the dies and the circumference of the wafer. As wafer sizes increase from 300 mm to 450 mm, the number of edge shots will also increase as a 450 mm wafer has approximately 1.5 times the circumference of a 300 mm wafer, increasing the amount of vacant, wasted space on the wafer.

Accordingly, an improved frame structure and shot layout methodology are desirable.

SUMMARY

In some embodiments, a system includes a computer readable storage medium and a processor in signal communication with the computer readable storage medium. The processor is configured to receive an integrated circuit chip size as an input and determine a frame structure segment size based on one chip size, establish an initial shot layout in which a number of shots arranged in vertically aligned columns and horizontally aligned rows to cover a semiconductor wafer, establish at least one additional shot layout, and compare the initial shot layout and the at least one additional shot layout to select a final shot layout. The frame structure segment size is less than the chip size. Each of the shots include at least one frame structure segment having the frame structure segment size and at least one chip. The initial shot layout has an initial chip count, and the at least one additional shot layout differs from the initial shot layout in that the at least one additional shot layout has at least one of a row of shots or a column of shots offset from an adjacent row or column of shots by an offset distance. The offset distance is based on the frame structure segment size. The final shot layout selection is based in part on the total number of shots in the shot layout and having a final chip count that is greater than or equal to the initial chip count.

In some embodiments, a method includes receiving an integrated circuit chip size as an input, determining a frame structure segment size based on the chip size, and establishing an initial shot layout in which a number of shots are arranged in vertically aligned columns and horizontally aligned rows to cover a semiconductor wafer. The frame structure segment size is less than the chip size, and each of the shots include at least one frame structure segment having the frame structure segment size and at least one chip. The initial shot layout has an initial chip count. At least one additional shot layout is established. The at least one additional shot layout differs from the initial shot layout in that the at least one additional shot layout has at least one of a row of shots or a column of shots offset from an adjacent row or column of shots by an offset distance. The offset distance is based on the frame structure segment size. The initial shot layout is compared to the at least one additional shot layout, and one of the initial shot layout and the at least one additional shot layout is selected as a final shot layout. The final shot layout selection is based in part on the total number of shots in the shot layout and having a final chip count that is greater than or equal to the initial chip count. The wafer is exposed to a light using the final shot layout. The methods may be embodied in a computer readable storage medium encoded with computer program code that may be loaded to a processor, such that when the processor executes the code it performs the method.

DETAILED DESCRIPTION

An improved method of semiconductor wafer processing is now described. In the new processing method, a new frame structure including alignment and monitor patterns, e.g., frame structure segments, is implemented enabling rows or columns of shots to be partially shifted (offset) with respect to adjacent rows or columns of shots. As a result, a semiconductor wafer may be fully developed with fewer shots while retaining the chip count per wafer. Decreasing the number of shots required to fully develop a wafer and in turn maintaining or increasing the chip count per wafer increases the productivity of a production line as the amount of time to produce the same number of chips is reduced.

Figure 1A:
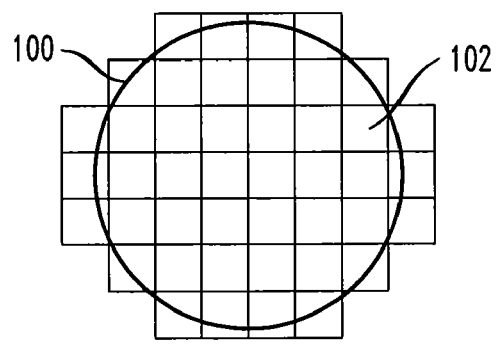
FIG. 1A illustrates a shot layout of a semiconductor wafer.
Figure 1B:
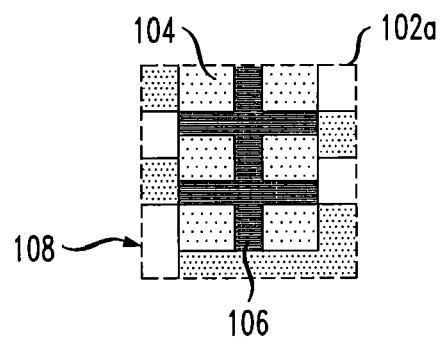
FIG. 1B illustrates a conventional shot area having a U-frame layout of integrated circuit chips and surrounding alignment and monitor patterns.
Figure 1C:
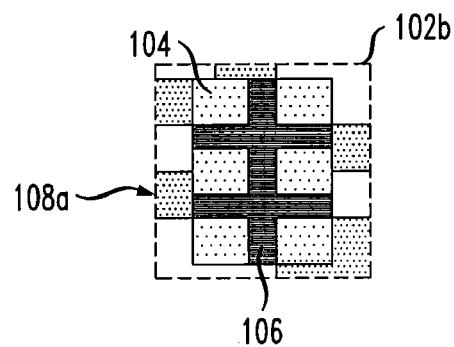
FIG. 1C illustrates a conventional shot area having an O-frame layout of integrated circuit chips and surrounding alignment and monitor patterns.
Figure 2A:
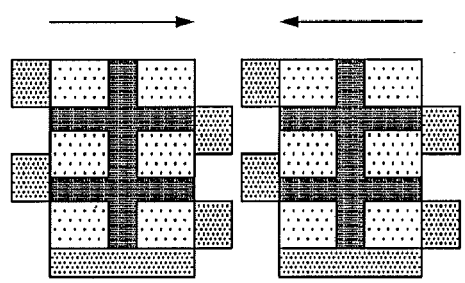
FIG. 2A illustrates two U-frame layouts being fit together.
Figure 2B:
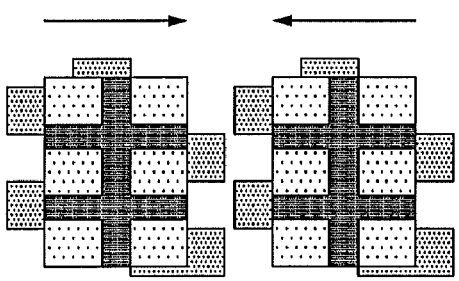
FIG. 2B illustrates two O-frame layouts being fit together.
Figure 3A:
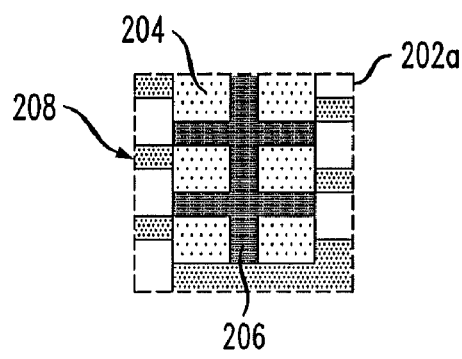
FIG. 3A illustrates one example of an improved shot cell layout having a U-frame configuration of integrated circuit chips and frame structure segments.
Figure 3B:
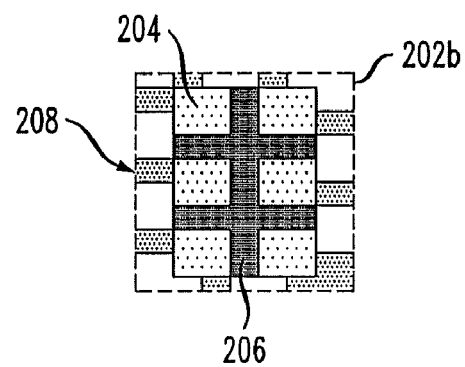
FIG. 3B illustrates one example of an improved shot cell layout having an O-frame configuration of integrated circuit chips and frame structure segments.

FIGS. 3A and 3B illustrate an improved frame structure for U-frames 202a and O-frames 202b, respectively. As shown in FIGS. 3A and 3B, the frame structure segments 208 are sized such that they are approximately one-half the size of the chips 204. Although the frame structure segments 208 are described as being reduced to a size of one-half the chip size, it is understood that frame structure segments 208 having other sizes that are less than the size of a chip may be implemented such as, for example, one-quarter chip size frame structure segments, one-eighth chip size frame structure segments, or the like. For the U-frame configuration illustrated in FIG. 3A, the frame structure segments 208 disposed on the left side of the shot 202a are located at the upper part of each chip 204, and the frame structure segments 208 on the right side of the shot 202a are located at the lower part of each chip 204. One skilled in the art will understand that the location of the frame structure segments 208 with respect to the chips 204 may be varied. As illustrated in FIG. 3B, the frame structure segments 208 are disposed on the upper or lower part of a chip 204 in the O-frame configuration, and the frame structure segments 208 arranged on the upper and lower edges of the shot 202b are disposed on the left or right side of the chips 204.

Figure 4A:
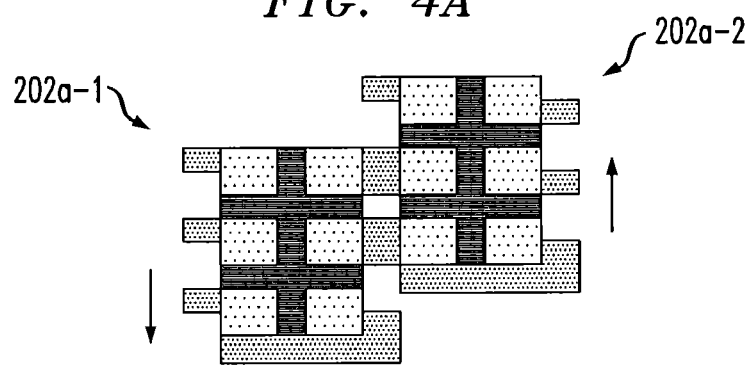
FIG. 4A illustrates one example of adjacent U-frame layouts being vertically shifted relative to one another in accordance with the U-frame layout illustrated in FIG. 3A.
Figure 4B:
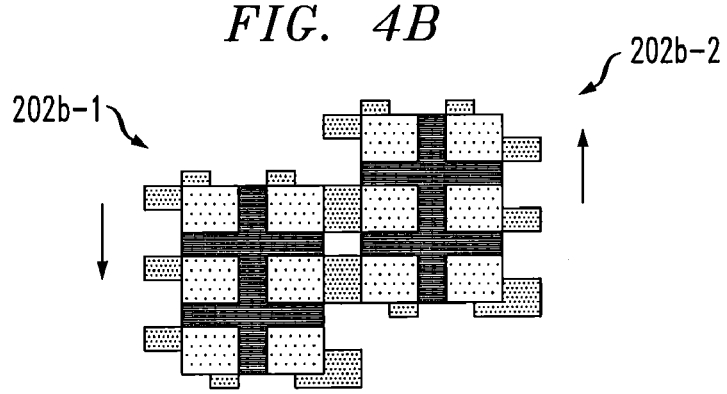
FIG. 4B illustrates one example of adjacent O-frame layouts being vertically shifted relative to one another in accordance with the O-frame layout illustrated in FIG. 3B.
Figure 4C:
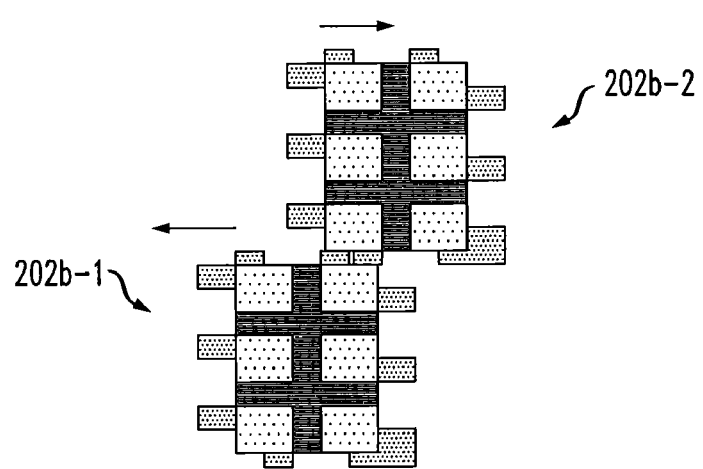
FIG. 4C illustrates one example of adjacent O-frame layouts being horizontally shifted relative to one another in accordance with the O-frame layout illustrated in FIG. 3B.

Reducing the size of the frame structure segments 208 enables adjacent shots, and consequently an entire row or column of shots, to be partially shifted with respect to each other as illustrated in FIGS. 4A-4C. The wafer may be exposed using a shot layout in which the frame structure segments 208 of an adjacent row or column of shots are staggered with respect to each other.

As shown in FIG. 4A, adjacent shots in the U-frame configuration may be shifted up or down such that a top of one shot 202a-1 does not align with, e.g., is offset from, a top of an adjacent shot 202a-2. Shot areas 202 b-1,202b-2 having an O-frame configuration may be moved up or down or left or right with respect to adjacent shots as illustrated in FIGS. 4B and 4C, respectively.

Figure 5A:
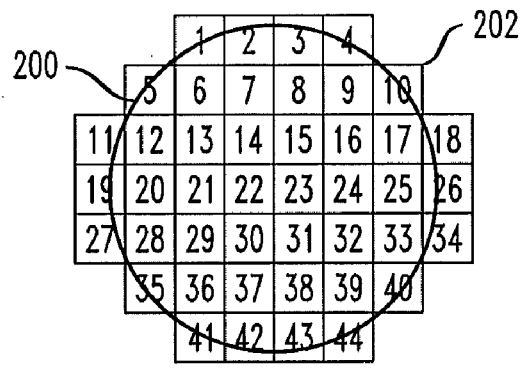
FIG. 5A illustrates one example of a layout of shots on a wafer.
Figure 5B:
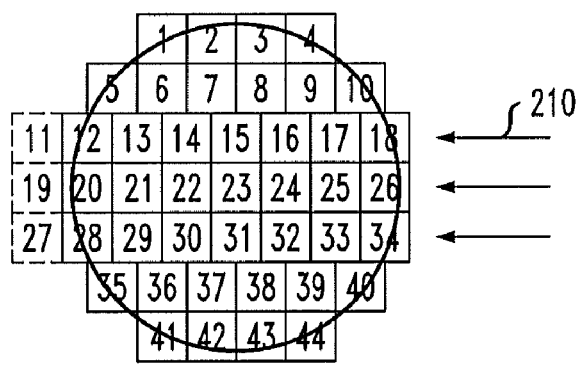
FIG. 5B illustrates one example of a plurality of rows of shots being horizontally shifted.

Shifting adjacent shots enables a more flexible shot layout of a semiconductor wafer 200. The added flexibility enables shot layouts to be selected in which the total number of shots is reduced and/or the number of partial edge shots may be reduced while retaining or increasing the total chip count of a wafer compared to full vertical and horizontal alignment of shots. FIG. 5A illustrates a semiconductor wafer 200, which may be fully developed in 44 shots 202, which are fully aligned with adjacent shots 202 in both the x-and y-directions. However, the frame structure segments 208 (not shown in FIG. 5A, see FIGS. 3A and 3B) in the shot areas 202 have a repeatable and reduced size that enables adjacent rows or columns of shots 202 to be shifted with respect to adjacent rows or columns of shots 202. The size and disposition of the frame structure segments enables the number of shots 202 needed to develop the entire wafer 200 to be reduced. For example, FIG. 5B illustrates a shot layout for the wafer 200 in which the third, fourth, and fifth rows from the top of the wafer 200 are shifted one chip size to the left as indicated by arrows 210. As shown in FIG. 5B, shifting the shots 202 in the third, fourth, and fifth rows to the left enables the wafer 200 to be fully developed by taking only 41 shots as shots 11, 19, and 27 may be eliminated since they are no longer located over any portion of the wafer 200. Although shots 11, 19, and 27 may be eliminated as they are moved off of the wafer, the chip count of the wafer is maintained as shots 18, 26, and 34 toward the interior of the wafer 200. Shots 18, 26, and 34 may be implemented such that they have more frame structure segments 208 compared to fully aligned shot layout in FIG. 5A, for process monitoring and to help check process variations during fabrication.

Figure 5C:
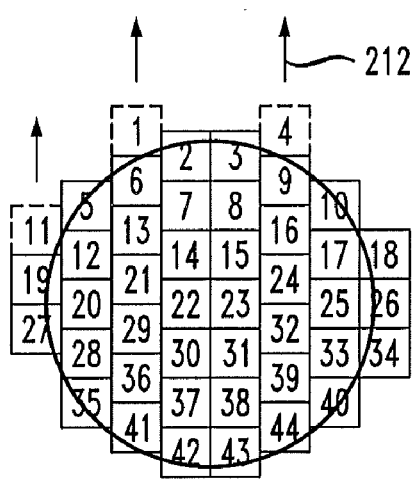
FIG. 5C illustrates one example of a plurality of columns of shots being vertically shifted.

Alternatively, several of the columns of shots 202 may be shifted up or down as illustrated in FIG. 5C. As shown in FIG. 5C, by shifting the first, third, and sixth columns of shots 202 from the left edge of the wafer 200 upwards as indicated by arrows 212 and maintaining the position of the remaining columns of shots 202, shots 1, 4, and 11 may be eliminated as they are no longer over any part of the wafer 200. Shots 41 and 44 may be implemented with additional frame structure segments 208 for process monitoring and to help check for process variations during fabrication. Accordingly, the wafer 200 may be fully developed in 41 shots compared to the 44 shots required to fully develop a wafer where each of the shots are fully aligned with adjacent shots in the x-and y-directions. It is understood that these two examples of shifting rows or columns of shots is not exhaustive and this technique may also be implemented to reduce the number of partial edge shots. A partial edge shot is a shot area in which less than all of the chips within a shot are able to be developed due to the shot area being located over an edge of the wafer (e.g., shots 2 and 3 in FIG. 5A). Accordingly, reducing the number of edge shots may result in more chips being developed in fewer shots.

Figure 6:
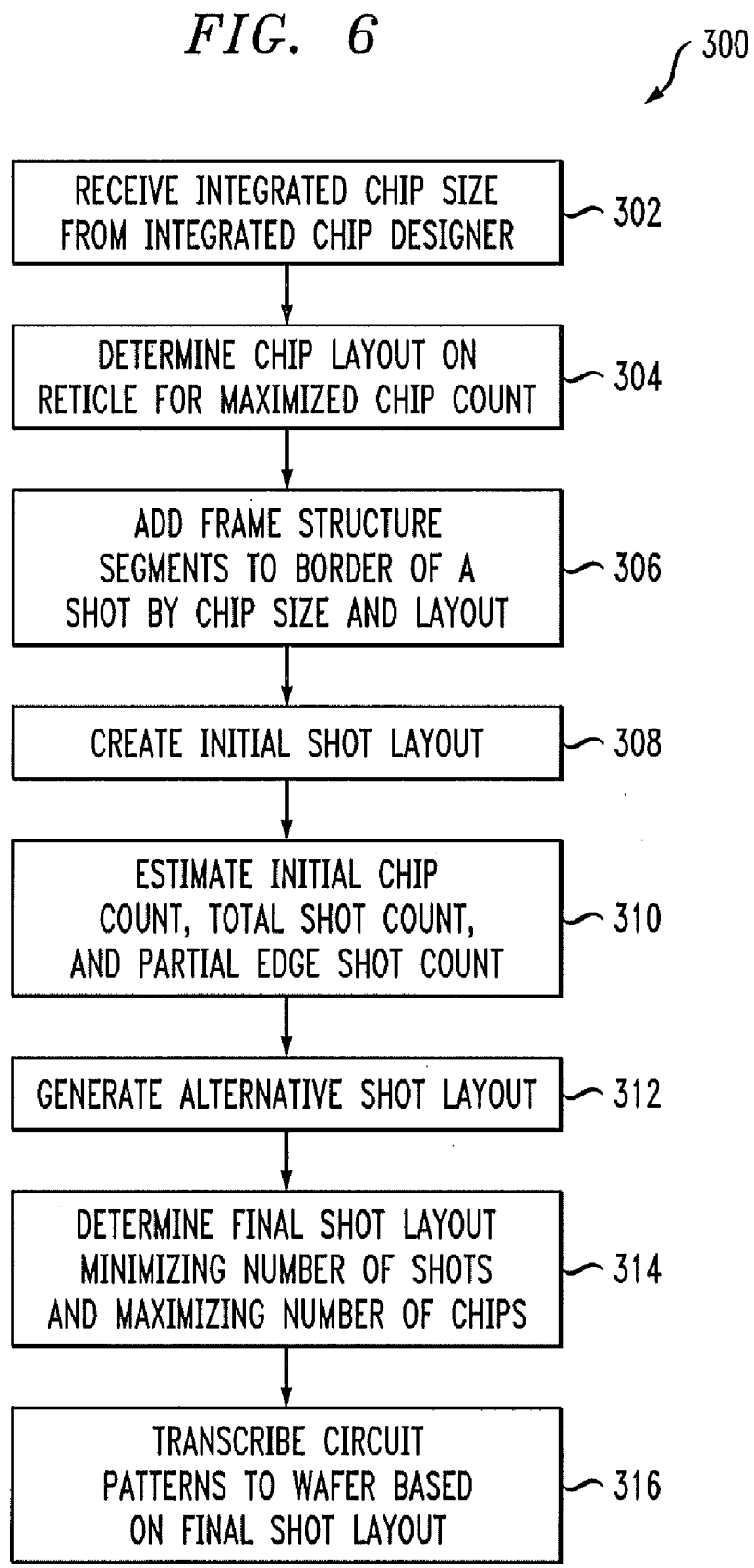
FIG. 6 is a flow diagram of one example of an improved method of determining a frame structure on a reticle and a shot layout of a wafer.

FIG. 6 illustrates one example of a method 300 of designing a shot layout for a semiconductor wafer. At block 302, a final design for an integrated circuit chip is received from a designer identifying a chip size. The chip layout that provides the maximum chip count on the reticle is determined at block 304. When determining the chip layout on the reticle, space at the periphery of each shot 202 is retained for frame structures 208.

At block 306, the size of a chip is used to determine the size of each frame structure segment 208. In some embodiments, the frame structure segments 208 have a size that is approximately one-half of the size of the integrated circuit chips 204, although it is understood that the frame structure segments may be of any other fractional size that is less than the size of the integrated circuit chips 204, e.g., three-quarters of the chip size, one-quarter of the chip size, etc. The frame structure segments 208 are added to the periphery of a shot 202 create a U-frame or an O-frame configuration on the reticle.

At block 308, an initial shot layout is created in which each of the shots are fully aligned with adjacent shots in both vertically and horizontally (e.g., in both the x- and y-directions) as illustrated in FIG. 5A. The shot layout is placed over the wafer 200 at an initial starting point, the number of chips that the wafer will provide when fully developed, e.g., initial chip count, is determined at block 310. The initial chip count value may be stored in a database along with the number of shots required to fully develop the wafer 200. The number of partial edge shots may also be determined and stored in a computer readable storage medium.

At block 312, one or more alternative shot layouts are generated. The one or more alternative shot layouts may be generated in which the fully aligned shot layout is offset from the initial starting point on the wafer, or one or more rows or columns of shots may be shifted (e.g., offset) with respect to an adjacent row or column of shots as illustrated in FIGS. 5B and 5C. As described above, the one or more rows or columns of shots may be offset with respect to an adjacent row or column of shots based on the size of a frame structure segment 208.

For example, if a frame structure segment 208 is implemented having a size that is approximately one-half the size of the chip, then a row or column of shots may be shifted or offset one chip size with respect to an adjacent row or column of shots. One skilled in the art will understand that if a smaller size of a frame structure segment 208 is used, e.g., one-quarter chip size, then a row or column of shots 202 may be shifted by a half-chip size, one chip size, two chip sizes, or the like with respect to an adjacent row or column of shots. An algorithm, such as the one disclosed in U.S. Pat. No. 7,353,077 issued to Lin et al., the entirety of which is incorporated by reference herein, may be used to optimize the shot layout.

The final shot layout is selected at block 314. The selection of the final shot layout may be performed by comparing the initial shot layout with each of the one or more alternative shot layouts. A number of factors may be taken into consideration when selecting the final shot layout including, but not limited to, the total chip count, the total number of shots required to fully develop the wafer, the number of partial edge shots, and/or the yield estimation of chips in partial edge shots. For example, the final shot layout that is selected may have a tradeoff between the total number of shots and the lowest number of partial edge shots while at the same time having a total chip count that is greater than or equal to the initial chip count. In another example, the shot layout that is selected for the final shot layout may be layout having the highest chip count with the fewest number of total shots.

The circuit pattern may be transcribed onto the wafer based on the final shot layout at block 316. The circuit pattern may be transcribed onto the wafer shot-by-shot by passing UV light through the reticle using a lithographic device. As described above, the lithographic device may take a plurality of shots to fully transcribe the circuit pattern onto the wafer such that the wafer is fully developed and the location of these shots is based on the final shot layout.

Figure 7:
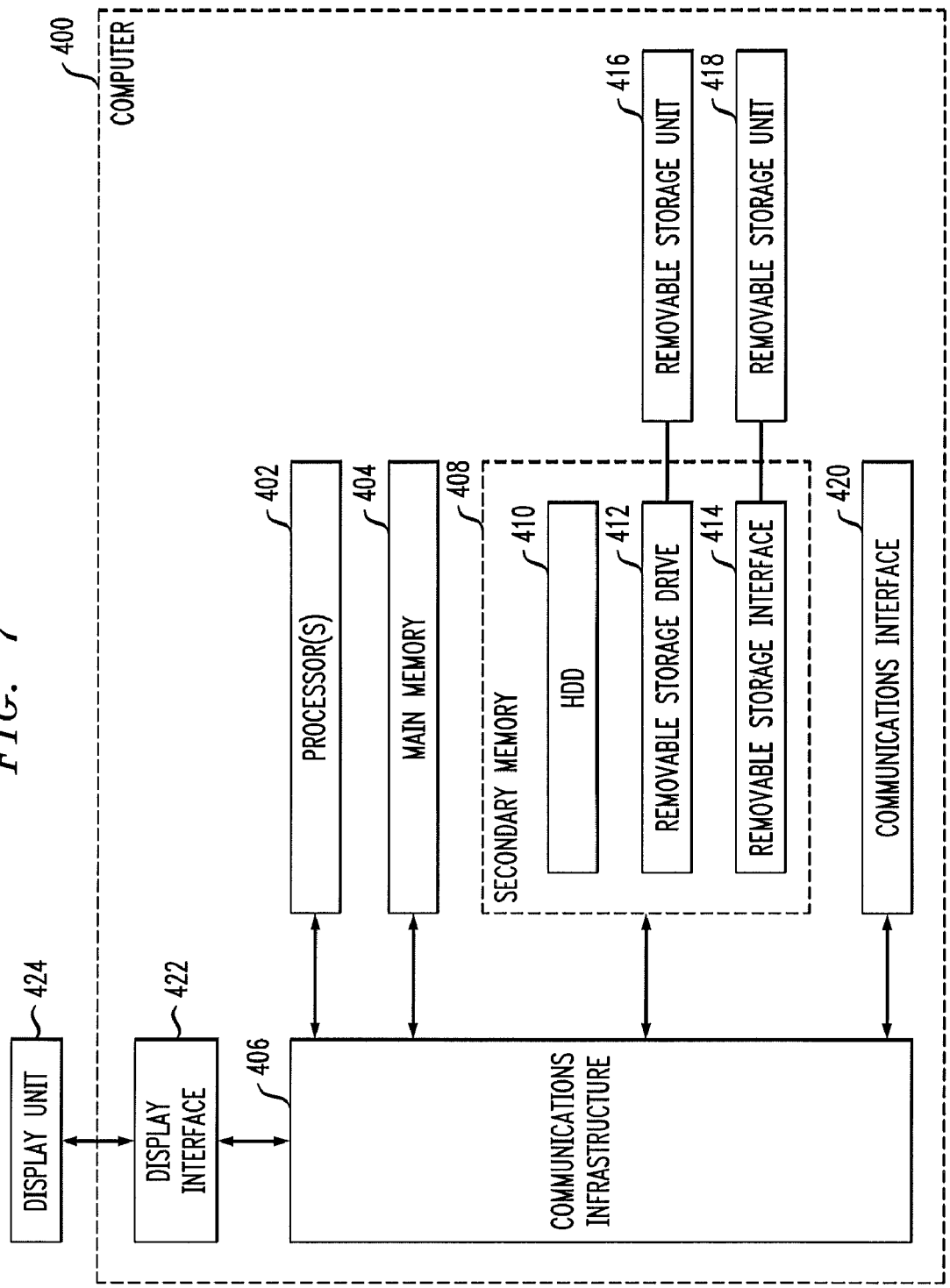
FIG. 7 is a block diagram of one example of a computer system that may be used to determine the shot layout on a wafer.

The method may be implemented using hardware, software, or a combination thereof and may be implemented in one or more computer systems or other processing systems. In one embodiment, the method is carried out in a computer system as illustrated in FIG. 7. As illustrated in FIG. 7, computer system 400 may include one or more processors, such as processor 402. The processor 402 is connected to a communication infrastructure 406 (e.g., a communications bus, cross-over bar, or network). Computer system 400 may include a display interface 422 that forwards graphics, text, and other data from the communication infrastructure 406 (or from a frame buffer not shown) for display on the display unit 424.

Computer system also includes a main memory 404, such as a random access (RAM) memory, and may also include a secondary memory 408. The secondary memory 408 may include, for example, a hard disk drive (HDD) 410 and/or removable storage drive 412, representing a floppy disk drive, a magnetic tape drive, an optical disk drive, or the like. The removable storage drive 412 reads from and/or writes to a removable storage unit 416. Removable storage unit 416 may be a floppy disk, magnetic tape, optical disk, or the like. As will be understood, the removable storage unit 416 may include a computer readable storage medium having stored therein computer software and/or data.

In alternative embodiments, secondary memory 408 may include other similar devices for allowing computer programs or other instructions to be loaded into computer system 400. Secondary memory 408 may include a removable storage unit 418 and a corresponding interface 414. Examples of such removable storage units include, but are not limited to, a USB or flash drives, which allow software and data to be transferred from the removable storage unit 418 to computer system 400.

Computer system 400 may also include a communications interface 420. Communications interface 420 allows software and data to be transferred between computer system 400 and external devices. Examples of communications interface 420 may include a modem, Ethernet card, wireless network card, a Personal Computer Memory Card International Association (PCMCIA) slot and card, or the like. Software and data transferred via communications interface 420 may be in the form of signals, which may be electronic, electromagnetic, optical, or the like that are capable of being received by communications interface 420. These signals may be provided to communications interface 420 via a communications path (e.g., channel), which may be implemented using wire, cable, fiber optics, a telephone line, a cellular link, a radio frequency (RF) link and other communication channels.

In this document, the terms "computer program medium" and "computer readable storage medium" refer to media such as removable storage drive 412, or a hard disk installed in hard disk drive 410. These computer program products provide software to computer system 400. Computer programs (also referred to as computer control logic) are stored in main memory 404 and/or secondary memory 408. Computer programs may also be received via communications interface 420. Such computer programs, when executed by a processor, enable the computer system 400 to perform the features of the method discussed herein. For example, main memory 404, secondary memory 408, or removable storage units 416 or 418 may be encoded with computer program code for performing the process shown in FIG. 6.

In an embodiment implemented using software, the software may be stored in a computer program product and loaded into computer system 400 using removable storage drive 412, hard drive 410, or communications interface 420. The software, when executed by a processor 402, causes the processor 402 to perform the functions of the method described herein. In another embodiment, the method may be implemented primarily in hardware using, for example, hardware components such as a digital signal processor comprising application specific integrated circuits (ASICs). In yet another embodiment, the method is implemented using a combination of both hardware and software.

In addition to the above described embodiments, the disclosed method and apparatus may be embodied in the form of computer-implemented processes and apparatus for practicing those processes. The present disclosed method and apparatus may also be embodied in the form of computer program code embodied in tangible media, such as floppy diskettes, read only memories (ROMs), CD-ROMs, hard drives, "ZIP™" high density disk drives, DVD-ROMs, blu-ray discs, flash memory drives, or any other computer-readable storage medium, wherein, when the computer program code is loaded into and executed by a computer, the computer becomes an apparatus for practicing the disclosed method and system. The present disclosed method and apparatus may also be embodied in the form of computer program code, for example, whether stored in a storage medium, loaded into and/or executed by a computer, wherein, when the computer program code is loaded into and executed by a computer, the computer becomes an apparatus for practicing the disclosed method and apparatus. When implemented on a general-purpose processor, the computer program code segments configure the processor to create specific logic circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for semiconductor wafer processing, comprising:
   receiving an integrated circuit chip size as an input;
   determining a frame structure segment size based on the chip size on a reticle, the frame structure segment size being less than the chip size;
   establishing an initial shot layout in which a number of shots are arranged in vertically aligned columns and horizontally aligned rows to cover a semiconductor wafer, each of the shots including at least one frame structure segment having the frame structure segment size and at least one chip, the initial shot layout having an initial chip count;
   shifting at least one of a row of shots or a column of shots relative to an adjacent row or column of shots by an offset distance to establish at least one additional shot layout that differs from the initial shot layout in that shots in the at least one shifted row or column of shots are not aligned with the shots in the adjacent row or column of shots with which they were aligned in the initial shot layout, the offset distance baked on the frame structure segment size;
   comparing the initial shot layout and the at least one additional shot layout; and
   selecting one of the initial shot layout and the at least one additional shot layout as a final shot layout based in part on a total number of shots and having a final chip count that is greater than or equal to the initial chip count; and
   exposing the wafer to a light using the final shot layout.

2. The method of claim 1, further comprising:
   arranging the frame structure segments around a periphery of a shot area, the frame structure segments arranged such that the frame structure segments of adjacent shot areas interlock with each other.

3. The method of claim 1, wherein the frame structure segment size is one-half the chip size.

4. The method of claim 1, wherein the total number of shots in the final shot layout is less than the number of shots in the initial shot layout.

5. The method of claim 1, wherein at least one column of shots in the final shot layout is shifted with respect to at least one other column of shots.

6. The method of claim 1, wherein at least one row of shots in the final shot layout is shifted with respect to at least one other row of shots.

7. The method of claim 1, wherein the final shot layout is based on a number of partial edge shots.

8. The method of claim 1, wherein the final shot layout is selected to maximize the chip count per wafer.

9. The method of claim 1, wherein the at least one additional shot layout includes a second additional shot layout, the second additional shot layout including vertically aligned columns and horizontally aligned rows of shots that are disposed at different locations over the wafer compared to the initial shot layout.

10. A system for semiconductor wafer processing, comprising:
    a computer readable storage medium; and
    a processor in communication with the computer readable storage medium, the processor configured with computer program code to:
       receive an integrated circuit chip size as an input;
       determine a frame structure segment size based on the chip size on a reticle, the frame structure segment size being less than the chip size;
       establish an initial shot layout in which a number of shots are arranged in vertically aligned columns and horizontally aligned rows to cover a semiconductor wafer, each of the shots including at least one frame structure segment having the frame structure segment size and at least one chip, the initial shot layout having an initial chip count;
       shift at least one of a row shots or a column of shots relative to an adjacent row or column of shots by an offset distance to establish at least one additional shot layout, the at least one additional shot layout differing from the initial shot layout in that shots in the at least one shifted row or column of shots are not aligned with shots in the adjacent row or column of shots with which they were aligned in the initial shot layout, the offset distance based on the frame structure segment size; and
       compare the initial shot layout and the at least one additional shot layout to select a final shot layout, the final shot layout selection based in part on a total number of shots in the shot layout and having a final chip count that is greater than or equal to the initial chip count.

11. The system of claim 10, wherein the frame structure segment size is one-half the chip size.

12. The system of claim 10, wherein the total number of shots in the final shot layout is less than the number of shots in the initial shot layout.

13. The system of claim 10, wherein at least one column of shots in the final shot layout is shifted with respect to at least one other column of shots.

14. The system of claim 10, wherein at least one row of shots in the final shot layout is shifted with respect to at least one other row of shots.

15. The system of claim 10, wherein the processor is further configured with computer program code to:

arrange the frame structure segments around a periphery of a shot area, the frame structure segments arranged such that the frame structure segments of adjacent shot areas interlock with each other.

16. The system of claim 10, wherein the at least one additional shot layout includes a second additional shot layout, the second additional, shot layout including vertically aligned columns and horizontally aligned rows of shots that are disposed at different locations over the wafer compared to the initial shot layout.

17. A computer readable storage medium encoded with program code, wherein when the program code is executed by a processor, the processor performs a method for processing a semiconductor wafer, the method comprising:
receiving an integrated circuit chip size as an input;
determining a frame structure segment size based on the chip size on a reticle, the frame structure segment size being less than the chip size;
establishing an initial shot layout in which a number of shots are arranged in vertically aligned columns and horizontally aligned rows to cover a semiconductor wafer, each of the shots including at least one frame structure segment having the frame structure segment size and at least one chip, the initial shot layout having an initial chip count;
shifting at least one of a row or shots or a column of shots relative to an adjacent row or column of shots by an offset distance to establish at least one additional shot layout that differs from the initial shot layout in that shots in the at least one shifted row or column of shots are not aligned with the shots in the adjacent row or column of shots with which they were aligned in the initial shot layout, the offset distance based on the frame structure segment size; and
comparing the initial shot layout and the at least one additional shot layout to select a final shot layout based in part on a total number of shots in the shot layout and having a final chip count that is greater than or equal to the initial chip count.

18. The computer readable storage medium of claim 17, wherein the method further comprises:
arranging the frame structure segments around a periphery of a shot area, the frame structure segments arranged such that the frame structure segments of adjacent shot areas interlock with each other.

19. The computer readable storage medium of claim 17, wherein the at least one additional shot layout includes a second additional shot layout, the second additional shot layout including vertically aligned columns and horizontally aligned rows of shots that are disposed at different locations over the wafer compared to the initial shot layout.

20. The computer readable storage medium of claim 17, wherein frame structure segment size is one-half the chip size.

21. The computer readable storage medium of claim 17, wherein the total number of shots in the final shot layout is less than the number of shots in the initial shot layout.

22. The computer readable storage medium of claim 17, wherein at least one column of shots in the final shot layout is shifted with respect to at least one other column of shots.

23. The computer readable storage medium of claim 17, wherein at least one row of shots in the final shot layout is shifted with respect to at least one other row of shots.

24. The computer readable storage medium of claim 17, wherein the final shot layout is based on a number of partial edge shots.

* * * * *

UNITED STATES PATENT AND TRADEMARK OFFICE
CERTIFICATE OF CORRECTION

PATENT NO. : 8,239,788 B2  Page 1 of 1
APPLICATION NO. : 12/537836
DATED : August 7, 2012
INVENTOR(S) : Chih-Wei Lin et al.

It is certified that error appears in the above-identified patent and that said Letters Patent is hereby corrected as shown below:

Column 7, Line 52, delete "baked" and insert -- based -- therefor.

Column 9, Line 7, delete the "," after the word "additional".

Signed and Sealed this
Thirteenth Day of November, 2012

David J. Kappos
*Director of the United States Patent and Trademark Office*